United States Patent
Lee et al.

(10) Patent No.: US 9,684,404 B2
(45) Date of Patent: Jun. 20, 2017

(54) DISPLAY DEVICE

(71) Applicant: Samsung Display Co., Ltd., Yongin-si, Gyeonggi-Do (KR)

(72) Inventors: Jeena Lee, Anyang-si (KR); Insu Baek, Seoul (KR); Juhyun Shin, Hwaseong-si (KR); Sungdong Park, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 11 days.

(21) Appl. No.: 14/739,533

(22) Filed: Jun. 15, 2015

(65) Prior Publication Data

US 2016/0147345 A1    May 26, 2016

(30) Foreign Application Priority Data

Nov. 25, 2014 (KR) .................. 10-2014-0165283

(51) Int. Cl.
G06F 3/045 (2006.01)
G06F 3/041 (2006.01)
H05K 1/14 (2006.01)

(52) U.S. Cl.
CPC .......... *G06F 3/0412* (2013.01); *H05K 1/147* (2013.01); *H05K 2201/10128* (2013.01)

(58) Field of Classification Search
CPC ........ G06F 3/0418; G06F 3/044; G06F 3/045; G06F 3/0412; G06F 3/0416; G09G 2300/0426; G09G 2330/06; G09G 3/3611; H05K 1/147; H05K 2201/10128
See application file for complete search history.

(56) References Cited

U.S. PATENT DOCUMENTS

| 2002/0180917 | A1 | 12/2002 | Jang |
| 2011/0141042 | A1 | 6/2011 | Kim et al. |
| 2011/0193817 | A1* | 8/2011 | Byun ............ G06F 3/0418 345/174 |
| 2011/0304564 | A1* | 12/2011 | Kim .............. G06F 3/044 345/173 |
| 2012/0062486 | A1 | 3/2012 | Kim et al. |
| 2014/0094219 | A1 | 4/2014 | Jung et al. |
| 2016/0198560 | A1* | 7/2016 | Shin ............ H05K 1/028 362/600 |

FOREIGN PATENT DOCUMENTS

| KR | 2002-0091996 A | 12/2002 |
| KR | 10-2007-0008880 A | 1/2007 |
| KR | 10-2011-0065957 A | 6/2011 |
| KR | 10-1076788 B1 | 10/2011 |
| KR | 10-2012-0028009 A | 3/2012 |
| KR | 10-2014-0042999 A | 4/2014 |
| KR | 10-2014-0046267 A | 4/2014 |

* cited by examiner

*Primary Examiner* — Nelson Rosario
(74) *Attorney, Agent, or Firm* — Robert E. Bushnell, Esq.

(57) ABSTRACT

A display device includes: a display panel including a first substrate and a second substrate facing each other; a printed circuit board (PCB) disposed on one side of the display panel; a first flexible pritned circuit board (FPCB) configured to connect the first substrate to the PCB; a second FPCB configured to connect the second substrate to the PCB; and an insulating member disposed between the first and second FPCBs.

13 Claims, 8 Drawing Sheets

DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 25 Nov. 2014 and there duly assigned Serial No. 10-2014-0165283.

BACKGROUND OF THE INVENTION

Field of the Invention

Embodiments of the present invention relate to a touch panel integrated display device.

Description of the Related Art

Display devices are categorized into a liquid crystal display (LCD), an organic light emitting display (OLED), a plasma display panel (PDP), and an electrophoretic display (EPD) and the like according to methods of light emission.

The display device may include a touch panel as an input device. The touch panel may include a substrate and a touch detection electrode disposed on the substrate. With the recent trend of a slim type display device, a touch panel integrated display device has been recently developed, in which a touch detection electrode is directly disposed on the substrate of the display panel. Such touch panel integrated display device may have a slim thickness, because a substrate of the touch panel is omitted.

The touch panel integrated display device may include a first flexible printed circuit board (FPCB) configured to connect a display panel and a printed circuit board (PCB), and a second FPCB configured to connect a touch detection electrode and the PCB.

However, in the case of the touch panel integrated display device, the first and second FPCBs may overlap each other, and the first and second FPCBs, in this case, may be brought into contact with each other, thereby causing electric noise.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

Aspects of embodiments of the present invention are directed to a touch panel integrated display device capable of preventing contact of the first FPCB with the second FPCB.

According to an exemplary embodiment of the present invention, a display device includes: a display panel including a first substrate and a second substrate facing each other; a printed circuit board (PCB) disposed on one side of the display panel; a first flexible pritned circuit board (FPCB) configured to connect the first substrate to the PCB; a second FPCB configured to connect the second substrate to the PCB; and an insulating member disposed between the first and second FPCBs.

The first and second FPCBs may at least partially overlap each other.

The PCB and the insulating member may overlap each other.

The insulating member includes: a first layer disposed on the PCB and the first FPCB; and a second layer with a first end portion of the second layer attached to the first layer and a second end portion of the second layer disposed on the second FPCB.

The first layer may include a plurality of protrusions extending from a first end portion thereof.

The protrusion may be attached to the second substrate.

The display device may further include an adhesive member disposed between the protrusion and the second substrate.

The protrusions may be spaced apart from each other by a distance greater than a width of the second FPCB.

The display device may include more than one second FPCBs, and the protrusion may have a width smaller than a gap between the second FPCBs.

The first layer may have at least one aperture through which the PCB is connected to the second FPCB.

The display device may further include a touch detection electrode disposed on the second substrate.

The second FPCB may connect the touch detection electrode to the PCB.

The display device may further include a first polarizer disposed on the first substrate and a second polarizer disposed on the touch detection electrode on the second substrate.

The touch detection electrode may include: first detection electrodes disposed along a first direction; second detection electrodes disposed along a second direction that intersects the first direction; a first bridge disposed between the first detection electrodes; and a second bridge disposed between the second detection electrodes, wherein the first and second bridges are not in contact with each other.

According to embodiments of the present invention, a display device may include an insulating member between a first FPCB and a second FPCB, thereby capable of preventing contact of the first FPCB with the second FPCB.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
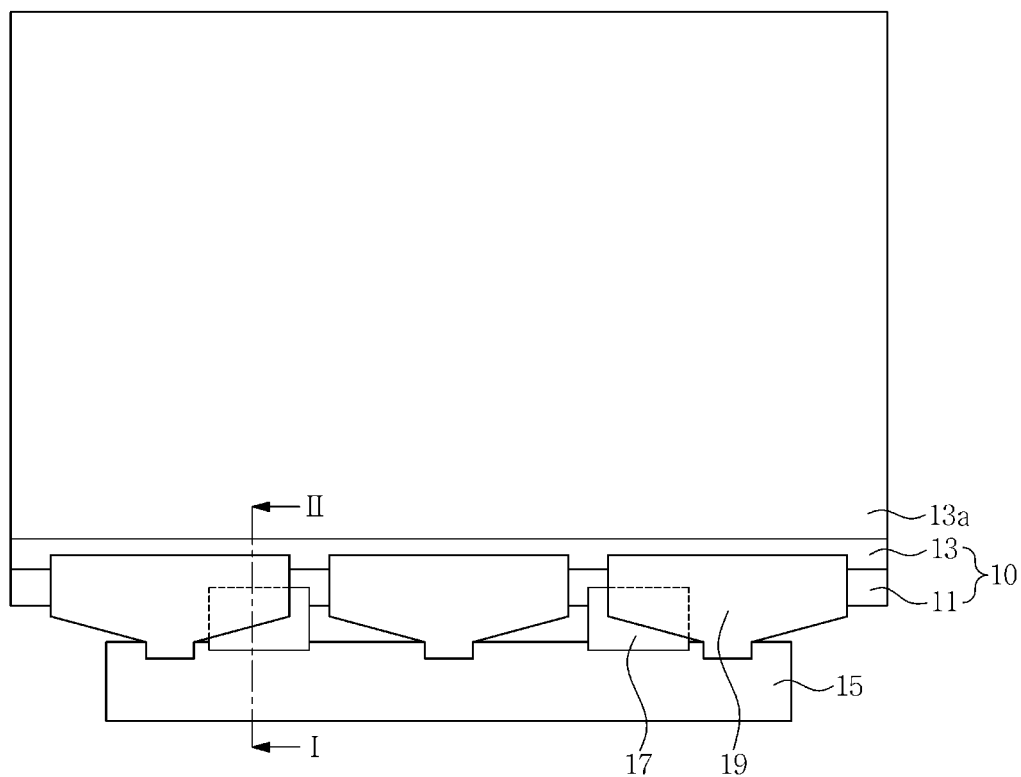
FIG. 1 is a schematic plan view illustrating a touch panel integrated display device.

Hereinafter, embodiments of the present disclosure of invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some of the parts which are not associated with the description may not be provided in order to specifically describe embodiments of the present invention, and like reference numerals refer to like elements throughout the specification.

Hereinafter, a display device according to an exemplary embodiment is described as an LCD panel. However, the display device according to an exemplary embodiment may be applied to an OLED device or a PDP device, other than a LCD device.

Further, the display device is described as including an edge type backlight unit, but is not limited thereto. In some embodiments, the backlight unit may be a direct type or a corner type.

Figure 2:
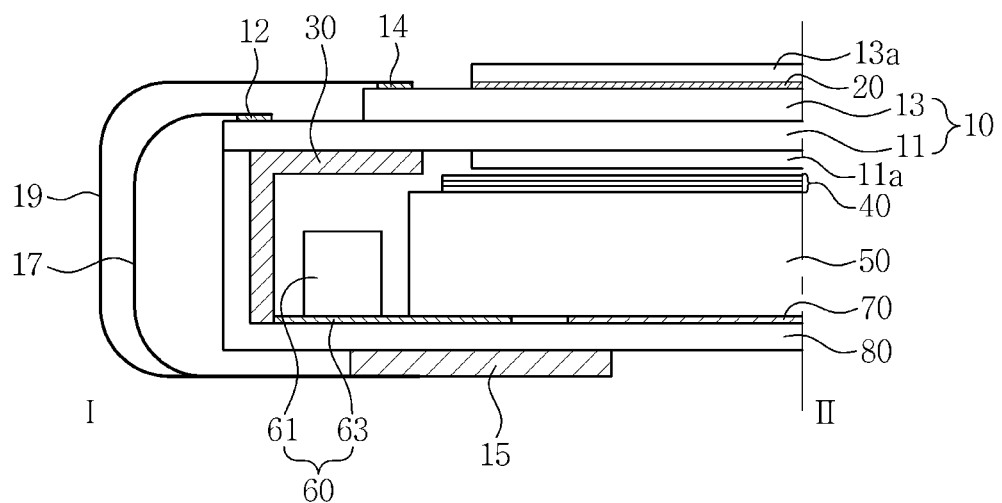
FIG. 2 is a schematic cross-sectional view illustrating a touch panel integrated display device.

FIG. 1 is a schematic plan view illustrating a touch panel integrated display device. FIG. 2 is a schematic cross-sectional view illustrating a touch panel integrated display device.

Referring to FIGS. 1 and 2, a touch panel integrated display device may include a display panel 10, a touch detection electrode 20, a mold frame 30, an optical sheet 40, a light guide plate 50, a light source unit 60, a reflection sheet 70, and a bottom chassis 80. The light source unit 60 may include a light source 61 and a circuit board 63 on which the light source 61 is disposed.

The display panel 10 may include first and second substrates 11 and 13 facing each other and a liquid crystal layer (not illustrated) disposed between the first and second substrates 11 and 13.

The first substrate 11 may include a plurality of data lines and a plurality of gate lines disposed to intersect each other, thin film transistors (TFTs) respectively disposed on pixel regions defined by intersections of the plurality of data and gate lines, and a pixel electrode connected to the TFT. Further, a driving pad 12 respectively connected to the data line and the gate line may be disposed at one edge portion of the first substrate 11.

The plurality of touch detection electrodes 20 may be disposed on the second substrate 13. Further, a touch pad 14 respectively connected to the plurality of touch detection electrodes 20 may be disposed on one edge portion of the second substrate 13.

A first polarizer 11a may be disposed on a rear surface of the first substrate 11 and a second polarizer 13a may be disposed on the plurality of touch detection electrodes 20 on the second substrate 13. The first and second polarizers 11a and 13a may have a size corresponding to the display panel 10.

A PCB 15 may be disposed on at least one side of the display panel 10. The PCB 15 is configured to provide various control signals and power signals for operating the display panel 10 and to determine a contact position based on a sensed signal provided from the touch detection electrode 20.

The touch panel integrated display device may include a first FPCB 17 configured to connect the driving pad 12 on the first substrate 11 and the PCB 15 and a second FPCB 19 configured to connect the touch pad 14 on the second substrate 13 and the PCB 15.

Referring to FIG. 1, the first and second FPCBs 17 and 19 may partially overlap each other, and the first and second FPCBs 17 and 19 may be brought into contact with each other at the overlapping area, thereby causing electric noise.

Accordingly, the present invention provides a touch panel integrated display device that may prevent contact of the first and second FPCBs 17 and 19.

Figure 3:
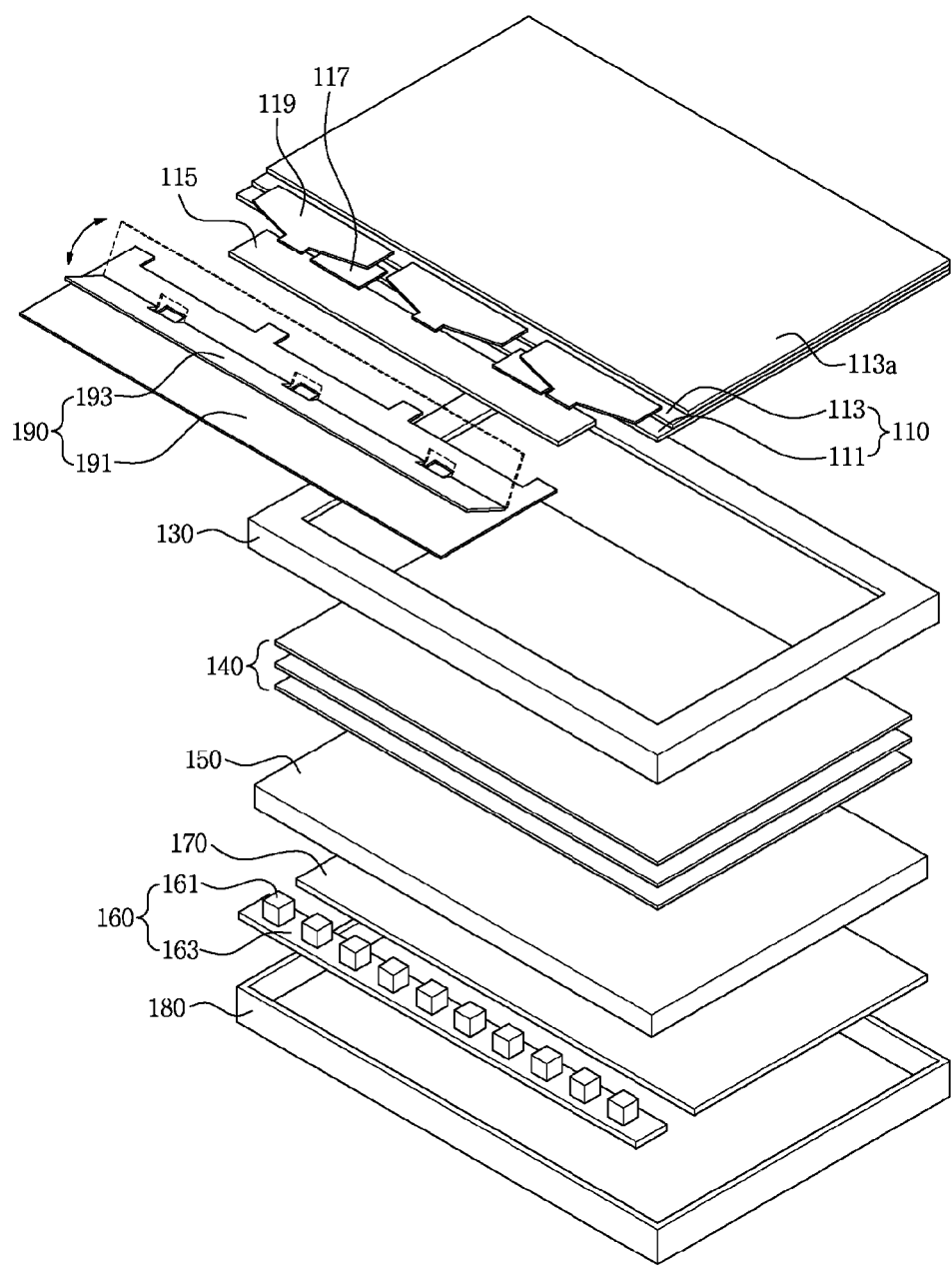
FIG. 3 is an exploded perspective view illustrating a display device according to an exemplary embodiment.
Figure 4:
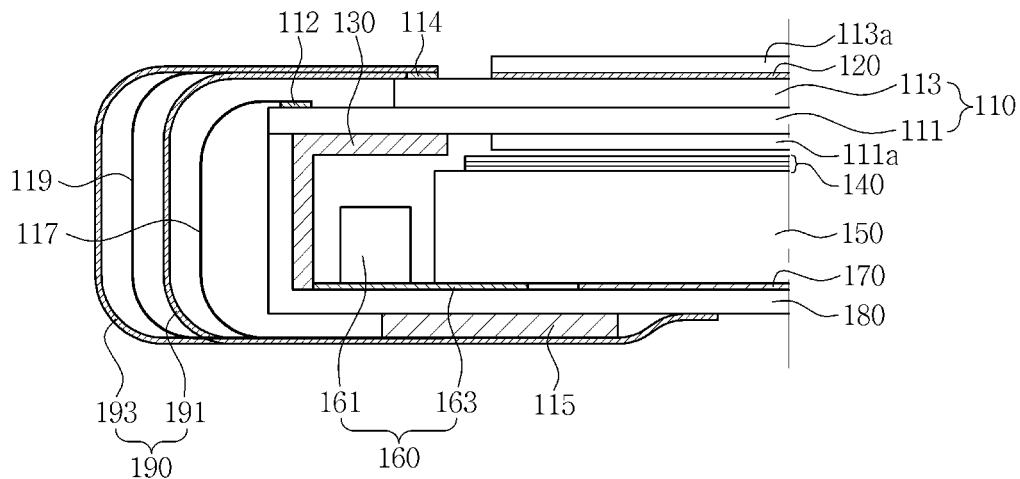
FIG. 4 is a cross-sectional view illustrating a display device according to an exemplary embodiment.

FIG. 3 is an exploded perspective view illustrating a display device according to an exemplary embodiment. FIG. 4 is a cross-sectional view illustrating a display device according to an exemplary embodiment.

Referring to FIGS. 3 and 4, a display device according to an exemplary embodiment may include a display panel 110, a touch detection electrode 120, a mold frame 130, an optical sheet 140, a light guide plate 150, a light source unit 160, a reflection sheet 170, a bottom chassis 180, and an insulating member 190.

Hereinafter, a structure including the mold frame 130, the optical sheet 140, the light guide plate 150, the light source unit 160, the reflection sheet 170, and the bottom chassis 180 can be called a backlight unit.

The display panel 110 may be provided in a quadrangular panel form that displays images. The display panel 110 may include first and second substrates 111 and 113 facing each other and a liquid crystal layer (not illustrated) between the first and second substrates 111 and 113.

The first substrate 111 may include a plurality of data lines and a plurality of gate lines disposed to intersect each other, thin film transistors (TFTs) respectively disposed on pixel regions defined by intersections of the plurality of data and gate lines, and a pixel electrode connected to the TFT. Further, a driving pad 112 respectively connected to the data lines and gate lines may be disposed on one edge portion of the first substrate 111.

The second substrate 113 may be disposed opposed to the first substrate 111 and may include a common electrode, which may include transparent conductive materials, and a color filter. The color filter may include red, green, and blue color filters.

The liquid crystal layer (not illustrated) may be disposed between the first and second substrates 111 and 113 and may be rearranged by an electric field formed between the pixel electrode and the common electrode. The rearranged liquid crystal layer may adjust transmittance of light emitted from the backlight unit. As the adjusted light passes through the color filter, images may be displayed outwards.

Figure 5:
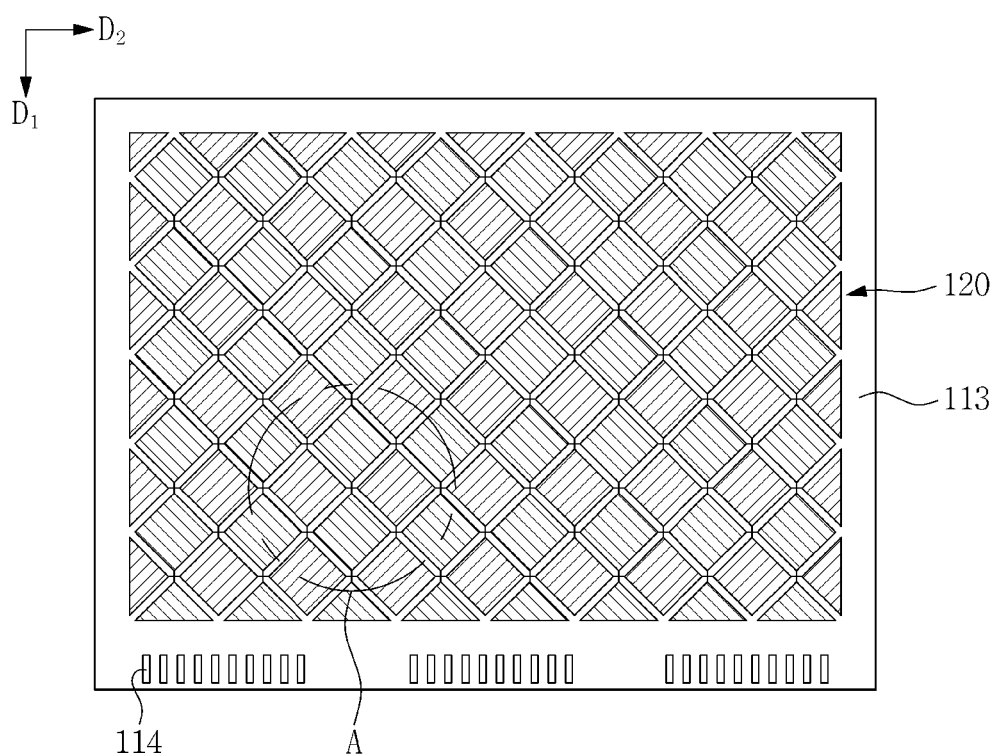
FIG. 5 is a view illustrating a touch detection electrode according to an exemplary embodiment.
Figure 6:
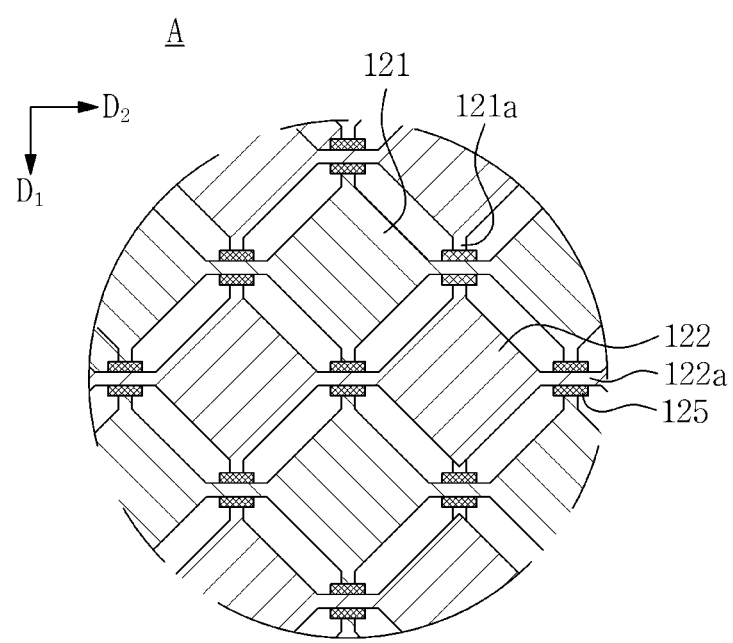
FIG. 6 is a partial enlarged view illustrating "A" portion of FIG. 5.

FIG. 5 is a view illustrating a touch detection electrode according to an exemplary embodiment. FIG. 6 is a partial enlarged view illustrating "A" portion of FIG. 5.

Referring to FIGS. 5 and 6, the touch detection electrode 120 may be disposed on the second substrate 113, and a touch pad 114 connected to the touch detection electrode 120 may be disposed on one edge portion of the second substrate 113. The touch detection electrode 120 may include a plurality of electrode members such as the first detection electrodes 121 and the second detection electrodes 122, and each pad members of the touch pad 114 may be electrically connected to the electrode members of the touch detection electrode 120 with a connection line (not illustrated).

The touch detection electrode 120 may include a plurality of first detection electrodes 121 disposed along a first direction (e.g., D1 direction) and a plurality of second detection electrodes 122 disposed along a second direction (e.g., D2 direction) intersecting the first direction, a first bridge 121a connecting the plurality of first detection electrodes 121 with each other in the first direction, a second bridge 122a connecting the plurality of second detection electrodes 122 with each other in the second direction, and an insulating layer 125 disposed between the first and second bridges 121a and 122a.

The first detection electrode 121, the second detection electrode 122, the first bridge 121a, and the second bridge 122a may include transparent conductive oxides (TCO). The TCO may include, for example, indium tin oxide (ITO), indium zinc oxide (IZO), and zinc oxide (ZnO). The insulating layer 125 may include, for example, transparent synthetic resins, a photo-active compound (PAC), and insulating ink.

In the display device according to an exemplary embodiment, the display panel 110 may include a plurality of pixels between the first and second substrates 111 and 113 disposed facing each other, and may also include the touch detection electrode 120 on the second substrate 113 for touch detection, thereby realizing an integral structure of a display panel and a touch screen.

Referring back to FIGS. 3 and 4, a first polarizer 111a may be disposed on a rear surface of the first substrate 111 and a second polarizer 113a may be disposed on the touch detection electrode 120 on the second substrate 113. The first and second polarizers 111a and 113a may have a size corresponding to the display panel 110. The first polarizer 111a may only allow light having a predetermined polarization direction among light emitted from the backlight unit to pass through, and absorb or block other light. The second polarizer 113a may only allow light having a predetermined polarization direction among externally incident light to pass through, and absorb or block other light.

The PCB 115 may be disposed on at least one side of the display panel 110. The PCB 115 may apply various control signals and power signals for operating the display panel 110 and may determine a contact position based on a sensed signal provided from the touch detection electrode 120.

The display device according to an exemplary embodiment may include a first flexible printed circuit board (FPCB) 117 configured to connect the driving pad 112 on the first substrate 111 to the PCB 115, and a second FPCB 119 configured to connect the touch pad 114 on the second substrate 113 to the PCB 115.

The first and second FPCBs 117 and 119 may be a chip on film (COF) or a tape carrier package (TCP), and the number of the FPCBs 117 and 119 may vary according to the size and driving method of the display panel 110.

A data driving integrated circuit may be mounted on the first FPCB 117, and a gate driving integrated circuit may be mounted on the second FPCB 119.

The mold frame 130 may have a quadrilateral-loop shape, may support an edge portion of a rear surface of the display panel 110, and may accommodate the optical sheet 140, the light guide plate 150, the light source unit 160, the reflective sheet 170, and the like. The mold frame 130 may be formed as a single unit, but a plurality of units may be assembled to form the mold frame 130, if necessary. The mold frame 130 may include flexible materials such as plastics and may be formed by an injection molding process and the like.

The optical sheet 140 may be disposed on the light guide plate 150 and configured to diffuse and/or collimate light directed from the light guide plate 150. The optical sheet 140 may include a diffusion sheet, a prism sheet, and/or a protective sheet. The diffusion sheet, the prism sheet, and the protective sheet may be sequentially laminated on the light guide plate 150 in the order listed.

The prism sheet may collimate light guided by the diffusion sheet 150, the diffusion sheet may diffuse light collimated by the prism sheet, and the protective sheet may protect the prism sheet. Light leaving the protective sheet may be directed toward the display panel 110.

The light guide plate 150 may uniformly direct light provided from the light source unit 160 to the display panel 110. The light guide plate 150 may be provided in a quadrilateral panel form, but is not limited thereto. When a light emitting diode (LED) chip is used as a light source, the light guide plate 150 may have various forms including predetermined grooves, protrusions, or the like depending on the position of the light source.

Although referred to as a plate only for the purpose of description, the light guide plate 150 may be in a shape of a sheet or a film, thereby achieving a slim display device. In other words, the light guide plate 150 is to be understood as having a concept including the plate and the film for guiding light.

The light guide plate 150 may include a light-transmissive material including, for example, acrylic resins, such as polymethylmethacrylate (PMMA), or polycarbonate (PC) so as to guide light efficiently.

The light source unit 160 may include a light source 161 and a circuit board 163 on which the light source 161 is disposed.

The light source 161 may be disposed at a corner portion or on a light incident side portion of the light guide plate 150. In other words, the light source 161 may emit light toward the corner portion or the light incident side portion of the light guide plate 150. The light source 161 may include at least one LED chip (not illustrated) and a package (not illustrated) for accommodating the LED chip. For example, the LED chip (not illustrated) may be a gallium nitride (GaN)-based LED chip that emits blue light.

The number of the light source 161 may vary in consideration of size and luminance uniformity of the display panel 110. The circuit substrate 163 may include a PCB or a metal PCB.

Although not illustrated in FIG. 3, a wavelength conversion unit (not illustrated) may be disposed between the light guide plate 150 and the light source unit 160. The wavelength conversion unit (not illustrated) may include a substance that can change wavelength of light. For example, the wavelength conversion unit may change a wavelength of blue light emitted from a blue LED light source, so that the blue light may be converted to white light.

Further, a heat dissipating member (not illustrated) may be disposed between the light source unit 160 and the bottom chassis 180. The heat dissipating member may release heat generated from the light source unit 160 to the outside. When the light source unit 160 is disposed on one side portion of the bottom chassis 180 in a bar or line shape, a metal frame having a bar or line shape may be disposed as the heat dissipating member. Accordingly, the heat dissipating member may have various shapes according to the shape of the light source unit 160.

The reflective sheet 170 may include, for example, polyethylene terephthalate (PET), and may reflect light. A surface of the reflective sheet 170 may be coated with a diffusion layer including, for example, titanium dioxide. The reflective sheet 170 may include materials containing metal, such as silver (Ag).

The bottom chassis 180 is responsible for maintaining a framework of the display device and protecting a variety of elements accommodated therein. The bottom chassis 180 may include materials having excellent rigidity and heat-dissipating properties. For example, the bottom chassis 180 may include at least one of aluminum, aluminum alloys, magnesium, magnesium alloys, copper, copper alloys, non-magnetic steel use stainless (SUS).

The insulating member 190 may include a first layer 191 disposed to cover the first FPCB 117 and the PCB 115 and a second layer 193 disposed to cover the second FPCB 119. The insulating member 190 may be formed of an insulating material. The insulating member 190 may be a film including at least one of, for example, polyethylene (PE), polypropylene (PP), polyethylene imine (PEI), polyethylene terephthalate (PET), polyphenylene sulfide (PPS), polyether ether ketone (PEEK), polyethylene naphtha rate (PEN), and polycarbonate (PC). The insulating member 190 will be described below in more detail.

Figure 7A:
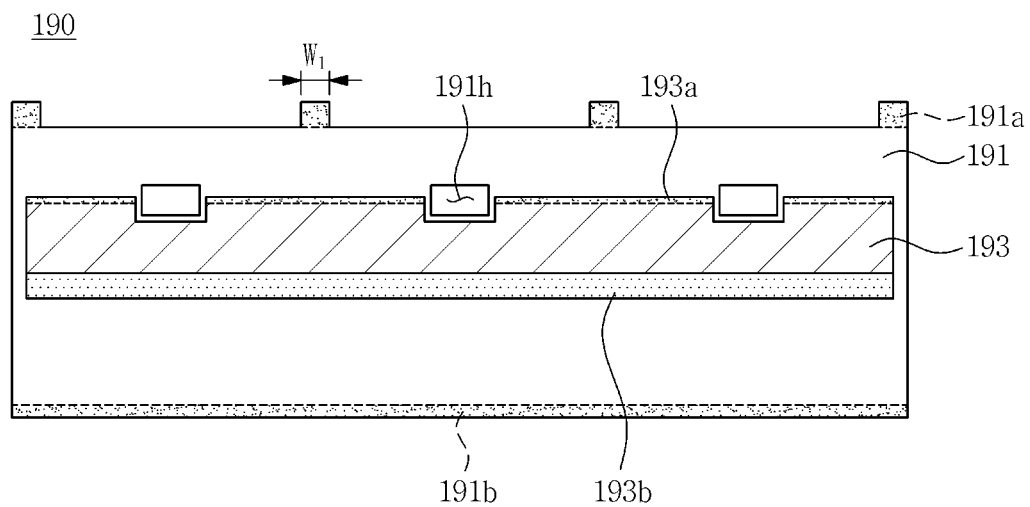
FIGS. 7A and 7B are views illustrating an insulating member according to an exemplary embodiment.
Figure 7B:
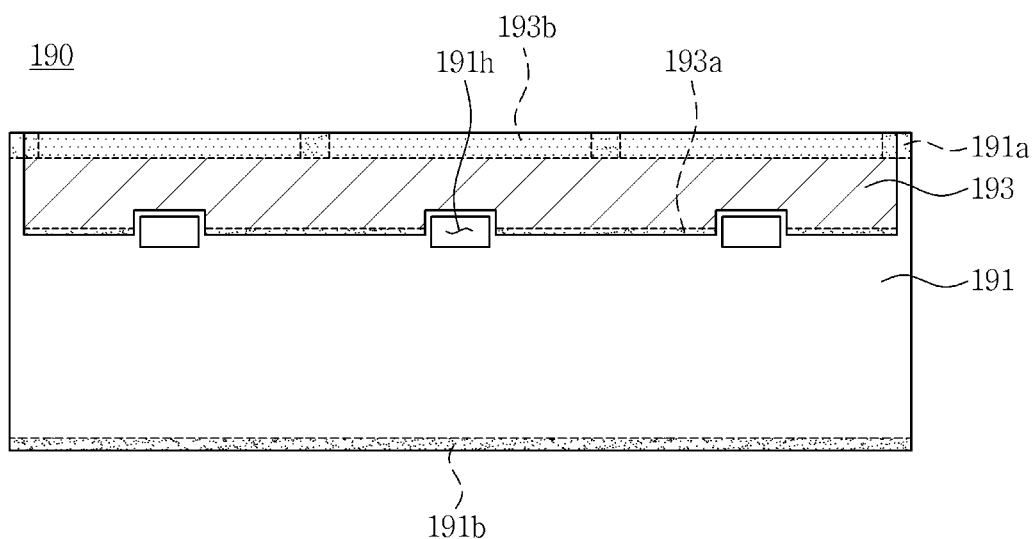

FIGS. 7A and 7B are views illustrating an insulating member according to an exemplary embodiment.

Referring to FIGS. 3, 4, 7A and 7B, the insulating member 190 according to an exemplary embodiment may include the first layer 191 on the first FPCB 117 and the PCB 115 and the second layer 193 partially attached to the first layer 191 and disposed on the second FPCB 119. The first layer 191 may be disposed between the first and second FPCBs 117 and 119.

The first layer 191 may include a plurality of protrusions 191a extending from a first end portion of the first layer 191. The protrusion 191a may be attached to the second substrate 113 of the display panel 110. An adhesive member may be disposed between the protrusion 191a and the second substrate 113 of the display panel 110.

A second end portion 191b of the first layer 191 may be attached to a rear surface of the bottom chassis 180. An adhesive member may be disposed between the second end portion 191b of the first layer 191 and the bottom chassis 180.

Figure 8A:
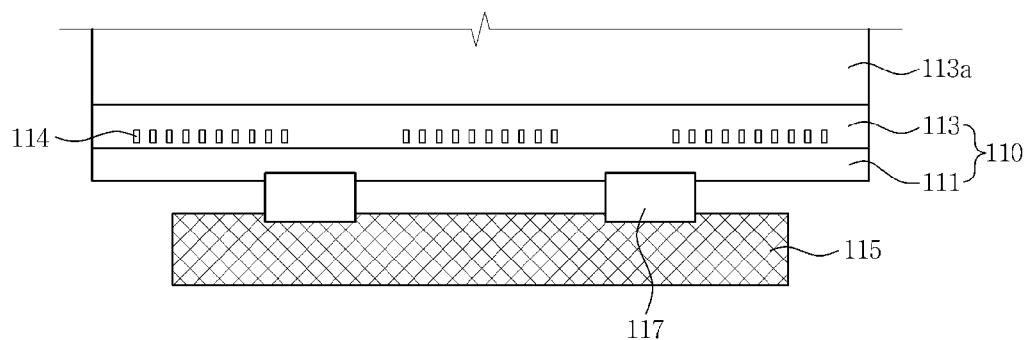
FIGS. 8A to 8D are views illustrating coupling of the insulating member according to an exemplary embodiment.
Figure 8B:
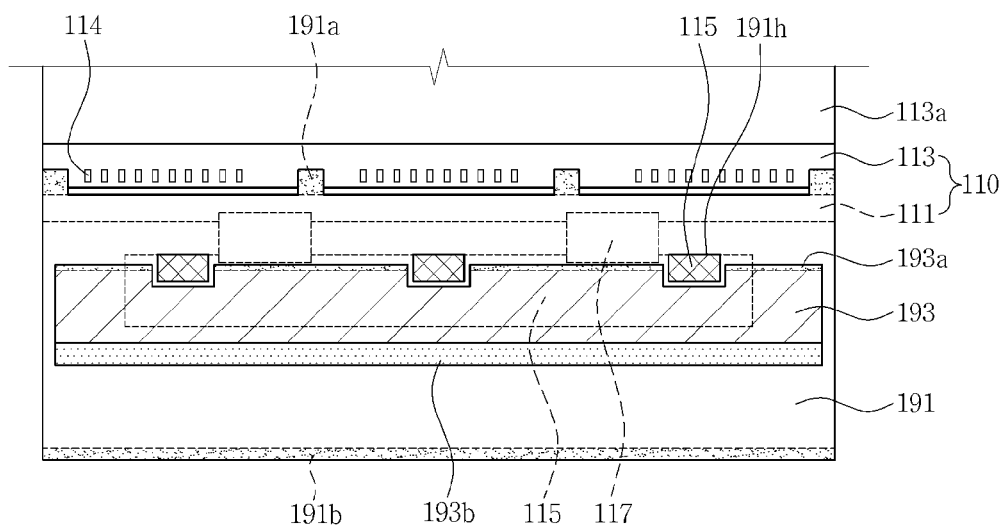
Figure 8C:
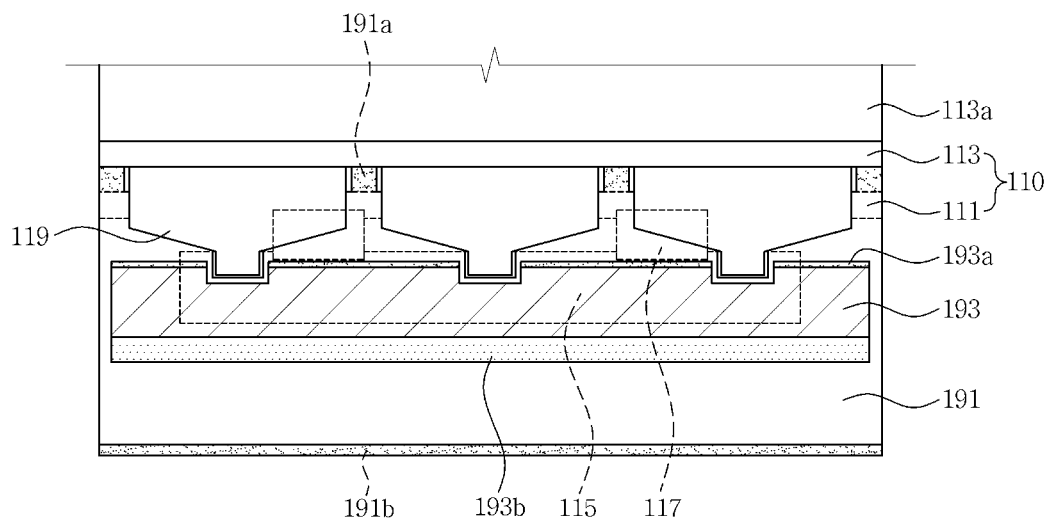

The protrusions 191a may be spaced apart from each other by a distance greater than a width of the second FPCB 119 attached to the second substrate 113 of the display panel 110 (as shown in FIG. 8C), and the protrusions 191a may have a width W1 smaller than a gap between the second FPCBs 119.

Further, the first layer 191 may have at least one aperture 191h through which the PCB 115 is connected to the second FPCB 119.

The second layer 193 may be partially attached to the first layer 191. FIGS. 7A and 7B illustrates that a first end portion 193a of the second layer 193 is attached to the first layer 191, but is not limited thereto. A second end portion 193b of the second layer 193 may be attached to the second substrate 113 of the display panel 110. The second layer 193 may be flipped with respect to the one end portion 193a attached to the first layer 191 as shown in FIG. 7B.

FIGS. 8A to 8D are views illustrating coupling of the insulating member according to an exemplary embodiment.

Referring to FIG. 8A, the first substrate 111 of the display panel 110 and the PCB 115 may be connected by the first FPCB 117.

Subsequently, referring to FIG. 8B, the first layer 191 of the insulating member 190 according to an exemplary embodiment may be disposed on the PCB 115 and the first FPCB 117. The protrusion 191a of the first layer 191 may be attached on the second substrate 113 of the display panel 110. The protrusions 191a of the first layer 191 may be attached to spaces between the plurality of touch pads 114 on the second substrate 113.

Next, referring to FIG. 8C, the second FPCB 119 may be attached to connect the second substrate 113 to the PCB 115. One end portion of the second FPCB 119 may be connected to the touch pad 114 on the second substrate 113, and another end portion of the second FPCB 119 may be connected to the PCB 115 through the aperture 191h provided on the first layer 191.

Figure 8D:
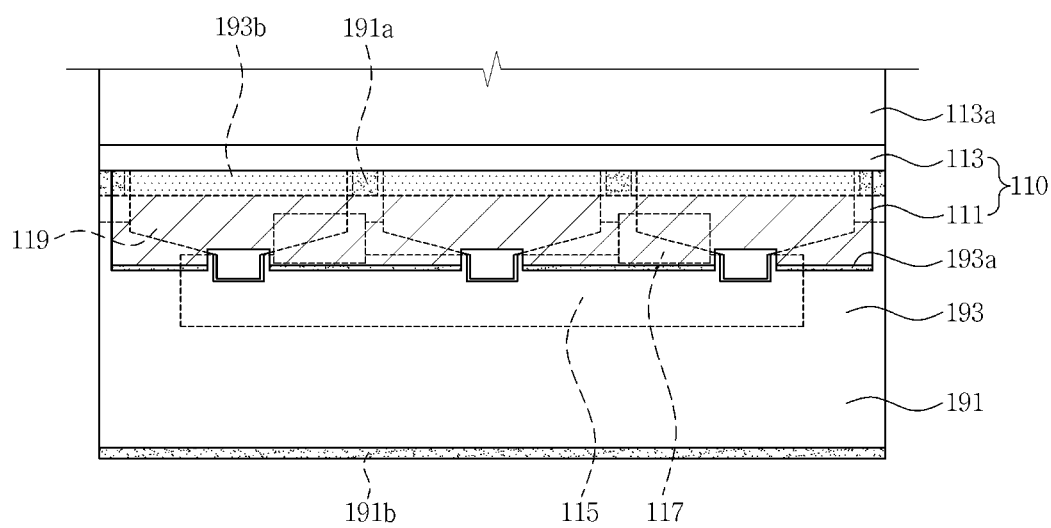

Next, referring to FIG. 8D, the second layer 193 may be flipped with respect to the first end portion 193a attached to the first layer 191 to be disposed on the second FPCB 119. The second end portion 193b of the second layer 193 may be disposed on the second substrate 113 to be attached thereto.

Then, the first FPCB 117, the second FPCB 119, the PCB 115, and the insulating member 190 may be bent toward the rear surface of the bottom chassis. The second end portion 191b of the first layer 191 of the insulating member 190 may be then attached to the rear surface of the bottom chassis.

As set forth above, according to an exemplary embodiment, the touch panel integrated display device including the insulating member may spatially separate and electrically insulate the first FPCB, which is configured to connect the display panel to the PCB, from the second FPCB, which is configured to connect the touch detection electrode to the PCB, thereby preventing noise between the first and second FPCBs caused by electric connection therebetween.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device, comprising:
    a display panel comprising a first substrate and a second substrate facing each other;
    a printed circuit board (PCB) disposed on one side of the display panel;
    a first flexible pritned circuit board (FPCB) configured to connect the first substrate to the PCB;
    a second FPCB configured to connect the second substrate to the PCB; and
    an insulating member disposed between the first and second FPCBs, wherein the insulating member comprises;
    a first layer disposed on the PCB and the first FPCB; and
    a second layer, a first end portion of the second layer attached to the first layer and a second end portion of the second layer disposed on the second FPCB.

2. The display device of claim 1, wherein the first and second FPCBs at least partially overlap each other.

3. The display device of claim 1, wherein the PCB and the insulating member overlap each other.

4. The display device of claim 1, wherein the first layer comprises a plurality of protrusions extending from a first end portion thereof.

5. The display device of claim 4, wherein the protrusion is attached to the second substrate.

6. The display device of claim 5, further comprising an adhesive member disposed between the protrusion and the second substrate.

7. The display device of claim 4, wherein the protrusions are spaced apart from each other by a distance greater than a width of the second FPCB.

8. The display device of claim 4, wherein the display device comprising more than one second FPCBs, and the protrusion has a width smaller than a gap between the second FPCBs.

9. The display device of claim 1, wherein the first layer has at least one aperture through which the PCB is connected to the second FPCB.

10. The display device of claim 1, further comprising a touch detection electrode disposed on the second substrate.

11. The display device of claim 10, wherein the second FPCB connects the touch detection electrode to the PCB.

12. The display device of claim 10, further comprising a first polarizer disposed on the first substrate, and a second polarizer disposed on the touch detection electrode on the second substrate.

13. The display device of claim 12, wherein the touch detection electrode comprises:
    first detection electrodes disposed along a first direction;
    second detection electrodes disposed along a second direction that intersects the first direction;
    a first bridge disposed between the first detection electrodes; and
    a second bridge disposed between the second detection electrodes, wherein the first and second bridges are not in contact with each other.

* * * * *